United States Patent [19]

Bone et al.

[11] Patent Number: 4,991,000
[45] Date of Patent: Feb. 5, 1991

[54] VERTICALLY INTERCONNECTED INTEGRATED CIRCUIT CHIP SYSTEM

[76] Inventors: Robert L. Bone, 24035 Rail Cir., Laguna Niguel, Calif. 92677; W. E. Armstrong, 27571 Cenajo, Mission Viego, Calif. 92691

[21] Appl. No.: 401,255

[22] Filed: Aug. 31, 1989

[51] Int. Cl.$^5$ .............. H01L 23/16; H01L 39/02; H01L 23/48; H01L 29/44
[52] U.S. Cl. .................... 357/75; 357/68; 357/80
[58] Field of Search ............... 357/68, 75, 80; 361/400, 404, 409, 412, 416

[56] References Cited

U.S. PATENT DOCUMENTS

| | | | |
|---|---|---|---|
| 4,221,047 | 9/1980 | Narken et al. | 29/840 |
| 4,239,312 | 12/1980 | Myer et al. | 339/17 N |
| 4,275,410 | 6/1981 | Grinberg et al. | 357/68 |
| 4,507,726 | 3/1985 | Grinberg et al. | 364/200 |
| 4,707,859 | 11/1987 | Nudd et al. | 382/28 |

FOREIGN PATENT DOCUMENTS 3233195 3/1983 Fed. Rep. of Germany ........ 357/75

OTHER PUBLICATIONS

Pfeiffer et al., "Self-Aligned Controlled Collapse Chip Connect (SAC4)", Journal of the Electro-Chemical Society: Solid-State Science and Technology, Nov. 1987, pp. 2940-2941.

T. Kawanobe, "Interconnection of Semiconductor Elements to Ceramic Substrates", Ceramics Japan, Mar. 1986, pp. 201-206, (Japanese and English Translation).

*Primary Examiner*—Rolf Hille
*Assistant Examiner*—D. Ostrowski
*Attorney, Agent, or Firm*—Terje Gudmestad; W. K. Denson-Low

[57] ABSTRACT

A high density IC layout is achieved by providing conductive feedthroughs through an IC chip directly to input/output locations within the circuitry, inward from the periphery of the chip or alternately at the periphery of the chip. The chip can thus be mounted to a substrate face up, allowing for visual inspection and simplified mounting techniques. To provide a high density 3-D stack, substrates with chips mounted thereon are stacked together, with substrate feedthroughs connecting to selected chip feedthrough via the substrate routing, and successive layers electrically connected by contact springs. Chips mounted on a single substrate can also be used in a 2-D configuration, without substrate feedthroughs.

13 Claims, 4 Drawing Sheets

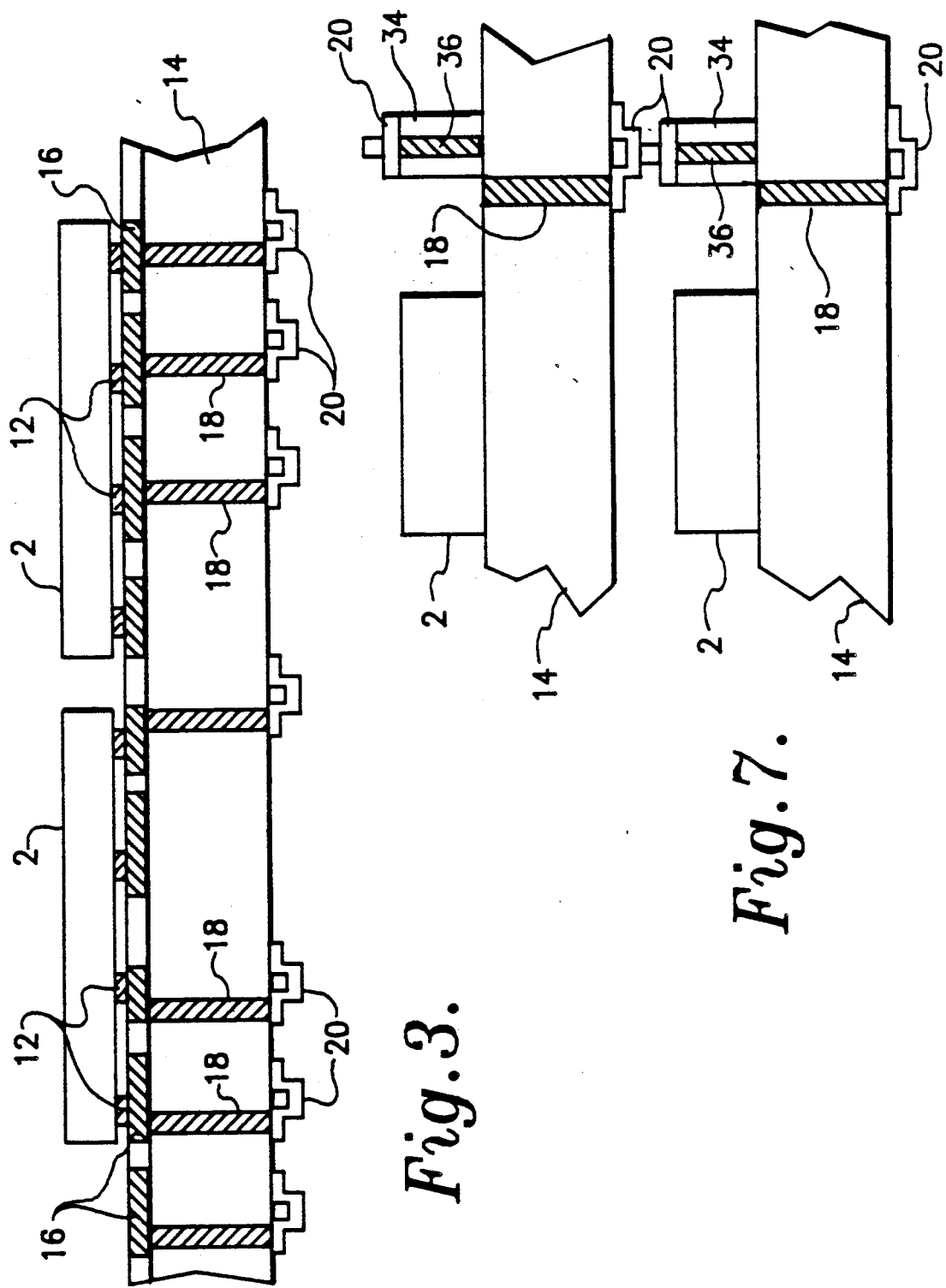

VERTICALLY INTERCONNECTED INTEGRATED CIRCUIT CHIP SYSTEM

BACKGROUND OF THE INVENTION

1. Field of the Invention

This invention relates to high density integrated circuit (IC) structures, and more particularly to a multilayer assembly employing discrete IC chips.

2. Description of the Related Art

There is a continuing need for microelectronic systems employing high density circuits with many data lines. Such systems are conventionally constructed with prefabricated IC circuits sealed in packages, mounted on printed circuit boards and provided with interconnections between the circuit packages by means of connectors, backplanes and wiring harnesses. To reduce the size, weight and power consumption of such systems, multiple chips can be sealed inside a single package.

A much higher level of integration at the lowest packaging level has been achieved with a new 3-D microelectronics technology which reorganizes the physical structure and approach to parallel computing and memory. In one application, a 3-D computer employs a large number of parallel processors, typically $10^4$-$10^6$, in a cellular array configuration. A wide variety of computationally intensive applications can be performed with substantial system level advantages. To handle the very large number of data lines (typically $10^4$-$10^6$), a stacked wafer approach is taken, with electrical signals passing through each wafer by means of specially processed feedthroughs. The wafers are interconnected by means of microbridge spring contacts.

The 3-D computer is described in U.S. Pat. Nos. 4,507,726 to Grinberg et al. and 4,707,859 to Nudd et al., both assigned to Hughes Aircraft Company, the assignee of the present invention. A plurality of elemental array processors are formed from a vertical stack of modules, with the modules arranged as functional planes; modules of a similar functional type are located on each plane. The various planes are implemented as separate wafers, each wafer having a unitary IC distributed over its upper surface with monolithically integrated interconnections between circuit elements. Interconnections between adjacent wafers in the stack are formed by electrically conductive feedthroughs which extend through the wafers from the IC on the upper surface to the lower surface, and a collection of microbridge spring contacts on both the upper and lower sides of the wafers. The spring contacts on the upper sides of the wafers make electrical contact with selected locations on the IC, while the spring contacts on the bottom electrically connect to selected feedthroughs. The spring contacts are positioned so that the ones on top of the wafer bear against and electrically connect to corresponding spring contacts on the bottom of the next wafer above. The feedthroughs can be formed by a thermal migration of aluminum, while the spring contacts are implemented as microbridges. Both techniques are described in U.S. Pat. Nos. 4,239,312 and 4,275,410, assigned to Hughes Aircraft Company.

While the processor described above provides a very high density of circuitry, it is limited in the sense that a custom designed IC is fabricated on each wafer, and that wafer can serve no other purpose. Furthermore, each wafer is generally limited to a single class of circuitry (CMOS bipolar, $I^2L$, etc.). A different approach to high density circuit packaging which provides a greater degree of freedom in the flexibility of circuit design involves the use of discrete chips mounted to a substrate and interconnected by means of wire bonding to a metallized interconnection network on the substrate surface. With wire bonding, all of the input/output ports for each chip are located around the periphery of the chip. Because of the area required to route signals to and from the periphery of the chip, typically only about 40% of the chip and substrate surface area is available for the actual circuitry, with about 60% dedicated to the input/output connections. In addition to a relatively inefficient use of chip and substrate surface area, the greater overall chip area required for a given amount of circuitry increases the rate of defects and reduces the manufacturing yield. Furthermore, the wire bond connections can reduce the circuit's speed of operation, and makes it difficult to use bulk attachment techniques in the manufacturing process. Similar problems apply to conventional "TAB" (tape automated bonding) connections.

A more recently developed approach to the placement of discrete IC chips on a substrate is the "flip chip" method. Rather than positioning the chip with the circuitry facing up and TAB or wire bonding from the substrate to the top of the chip, with the flip chip technique the chip is turned upside down, with connections made to the substrate metallization network by solder "bump" bonding. A subsequent wire bonding step after the chips have been mounted is thus eliminated. The flip chip technique is discussed, for example, in Pfeiffer et al., "Self-Aligned Controlled Collapse Chip Connect (SAC4)", *Journal of the Electro-Chemical Society: Solid-State Science and Technology*, Nov. 1987, pages 2940-2941, and T. Kawanobe, "Interconnection of Semiconductor Elements to Ceramic Substrates", *Ceramics Japan*, Mar. 1986 pages 201-206.

While eliminating some of the problems associated with TAB and wire bonding, the flip chip approach has its own limitations. First, there are problems in properly aligning the chip with the interconnect routing on the substrate. Since the process of cutting out the chip from its original wafer is not completely coordinated with the positioning of the input-output pads, the positions of the pads cannot be precisely predicted based upon the shape of the chip after it has been flipped over. Accordingly, complex and expensive attachment techniques are required to accurately attach the chips to the substrate. Also, for large chips having many closely spaced input/output pads around the edge, it is difficult to solder the pads to the substrate routing without the solder squeezing out to adjacent pads. Furthermore, the fact that the chips are mounted upside down precludes visual inspection after the assembly has been completed, and thus rules out the flip chip method for certain applications in which visual inspection is part of mandatory quality control procedures. It also precludes the use of "universal designs", i.e., the use of wire bonds or solder bumps.

SUMMARY OF THE INVENTION

In view of the limitations of the prior chip mounting and 3-D stacking approaches mentioned above, the present invention seeks to provide a new chip mounting technique which efficiently utilizes the available chip area, does not require post-attachment steps such as TAB or wire bonding, uses a relatively small amount of chip area for a given IC and therefore has a favorable manufacturing yield, leaves the active chip surface exposed after mounting and thus improves quality control procedures while simplifying the mounting procedure, and eliminate the problem of solder from one input/output pad spilling over to an adjacent pad or onto the active circuit area of the IC.

These improvements are achieved by the addition of electrically conductive feedthroughs through the IC chips directly from the input/output ports in the IC circuit to the underside of the chip body. The chips can then be mounted onto a substrate face up, with connections to the substrate metallization made on the underside of the chip via the feedthroughs. This in effect moves the input/output ports directly into the IC area, rather than bringing them out to the periphery of the chip. The result is a substantial reduction in routing, and a corresponding savings in chip and substrate area. Also, since it is not necessary to flip the chip over, the mounted chips can be visually inspected and conventional chip mounting equipment can be used.

When applied to a 3-D multi-layer stack, feedthroughs are also provided through the substrates running from their interconnect circuits on one side to their opposite sides. Connections between adjacent layers are made by mating pairs of microbridge spring contacts, one contact of each pair being attached to the underside of a substrate feedthrough and the other contact attached directly to the surface of a chip. Alternately, the latter spring contact can be mounted on a standoff which is connected to the chip via the substrate metallization and chip feedthroughs. The substrate metallization networks interconnect their respective chips with each other, and also furnish contact points for the substrate feedthroughs.

These and other features and advantages of the invention will be apparent to those skilled in the art from the following detailed description of preferred embodiments, taken together with the accompanying drawings, in which:

DESCRIPTION OF THE DRAWINGS

FIG. 3 is a partially sectioned view showing IC chips mounted on a substrate in accordance with the invention;

FIG. 7 is a sectional view illustrating an alternate multi-layer interconnection arrangement.

DETAILED DESCRIPTION OF THE INVENTION

Figure 1:
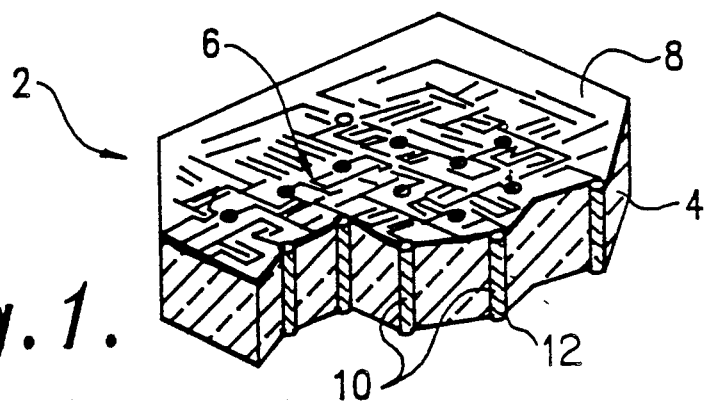
FIG. 1 is a cutaway perspective view of a portion of a IC chip constructed in accordance with the invention.

A single IC chip 2 is shown in FIG. 1 to illustrate the basic principals of the invention. It consists of a conventional semiconductor chip body 4, on the upper surface of which an IC pattern 6 is formed by conventional techniques such as diffusion, ion implantation, etc.

The input/output points are typically dispersed throughout the circuit. With conventional TAB or wire bonding, the IC would include separate leads whose sole purpose was to bring the input/output points out to the periphery 8 of the chip, where physical connections could be made to the substrate upon which the chip was mounted. With the present invention, by contrast, input/output connections are made directly at the locations where they occur in the IC, inward from the chip periphery 8. These connections are made by means of electrically conductive feedthroughs 10 which extend from the input/output points of the IC to the underside of the chip. The feedthroughs may presently be formed either by an aluminum thermo-migration process, or by metallizing a laser drilled or etched hole through the chip by plating, sputter deposition, electrolysis, vacuum deposition, etc. The aluminum thermo-migration process is described in U.S. Pat. Nos. 4,239,312 and 4,275,410.

One limitation of aluminum thermo-migration is that, for a 0.5mm (20 mil) thick chip and a 0.05mm (2 mil) feedthrough diameter, the feedthrough resistance is about 20–40 ohms, which is appreciable for certain applications. Feedthroughs using lower resistance materials might be developed in the future, or the resistance could be lowered by using thinner chips and/or wider diameter feedthroughs. Metallizing a hole drilled or etched through the chip would also provide a lower resistance feedthrough, but at present the drilling technique is relatively time-consuming. Since an aluminum migration can drift laterally up to about 0.025mm (1 mil) in transit through a 0.5mm chip, a spacing of about 0.1mm (4 mil) should be designed in for 0.05mm diameter feedthroughs.

Figure 2:
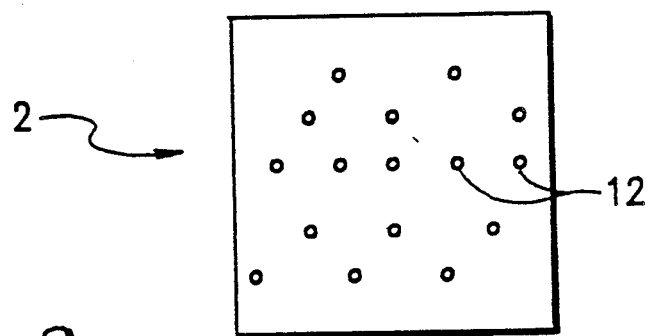
FIG. 2 is a simplified bottom view of an IC chip showing a possible pattern of chip feedthroughs in accordance with the invention.

FIG. 2 illustrates the underside of the chip 2. A "bump" 12 of conductive material is positioned over the underside of each chip feedthrough, and in electrical contact therewith. The bumps 12 are used to mount the chip to an underlying substrate and establish electrical connections therewith. They may be formed from materials such as solder, gold, silver, or conductive polymers defined by photolithographic or screen printing techniques. As illustrated in the figure they are dispersed inwardly from the chip periphery, at locations corresponding to the actual input/output locations of the IC on the opposite side of the chip, or alternately on the periphery as in conventional off-the-shelf ICs.

FIG. 3 shows a pair of chips 2 mounted on an insulative substrate 14, such as ceramic or sapphire. A metallized interconnection network, or "routing" 16 on the upper substrate surface interconnects the various chips on that substrate, and also provides input/output functions. A plurality of feedthroughs 18 extend through the substrate from selected locations on the routing 16 to interlayer contacts on the underside of the substrate. These contacts are preferably implemented as microbridge spring contacts 20, described in U.S. Pat. Nos. 4,239,312 and 4,275,410, mentioned above. The substrate feedthroughs 18 provide a means for interconnecting the IC chips on the substrate with those of adjacent substrates in a 3-D stack, and can function in effect as data buses for a 3-D computer, memory stack, or other 3-D high density IC device. They can be formed in a manner similar to the chip feedthroughs.

The chips 2 are mounted to the substrate routing 16 by the solder or other conductive deposits 12 on the underside of the chips. Solder is generally preferred over the other materials because of its easy handling, but could not be used with the high pitch input/output flip chip technique because of the possibility of its running onto adjacent input/output ports; the dispersion of the chip feedthroughs throughout the IC circuit inward of the chip periphery, and the provision of the contacts 12 on the underside of the chips makes the use of solder possible with the invention. Since the ICs face upward and can be seen, conventional automatic die placement equipment can be used to mount the chips to the substrate.

Figure 4:
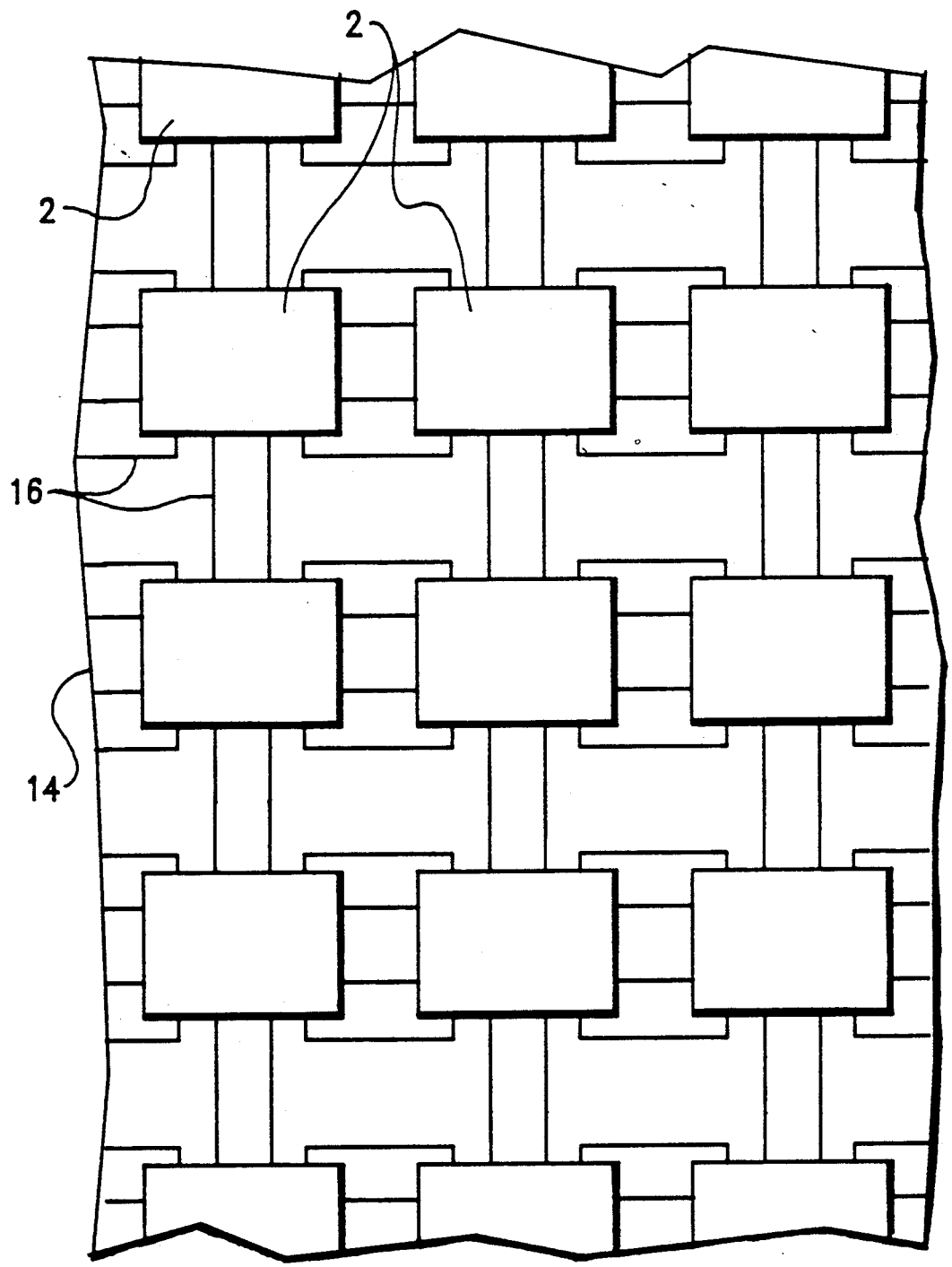
FIG. 4 is a plan view of a portion of a substrate with chips mounted thereon.

The distribution of IC chips 2 on the surface of substrate 14 is illustrated in FIG. 4. The substrate metallized routing 16 is shown as interconnecting the chips in any desired pattern, as well as providing contact points for the substrate feedthroughs 18 shown in FIG. 3. It is not necessary to locate the substrate feedthroughs 18 directly below the chip feedthroughs 10, since the routing 16 can move the connections between the two sets of feedthroughs laterally along the substrate surface.

Figure 5:
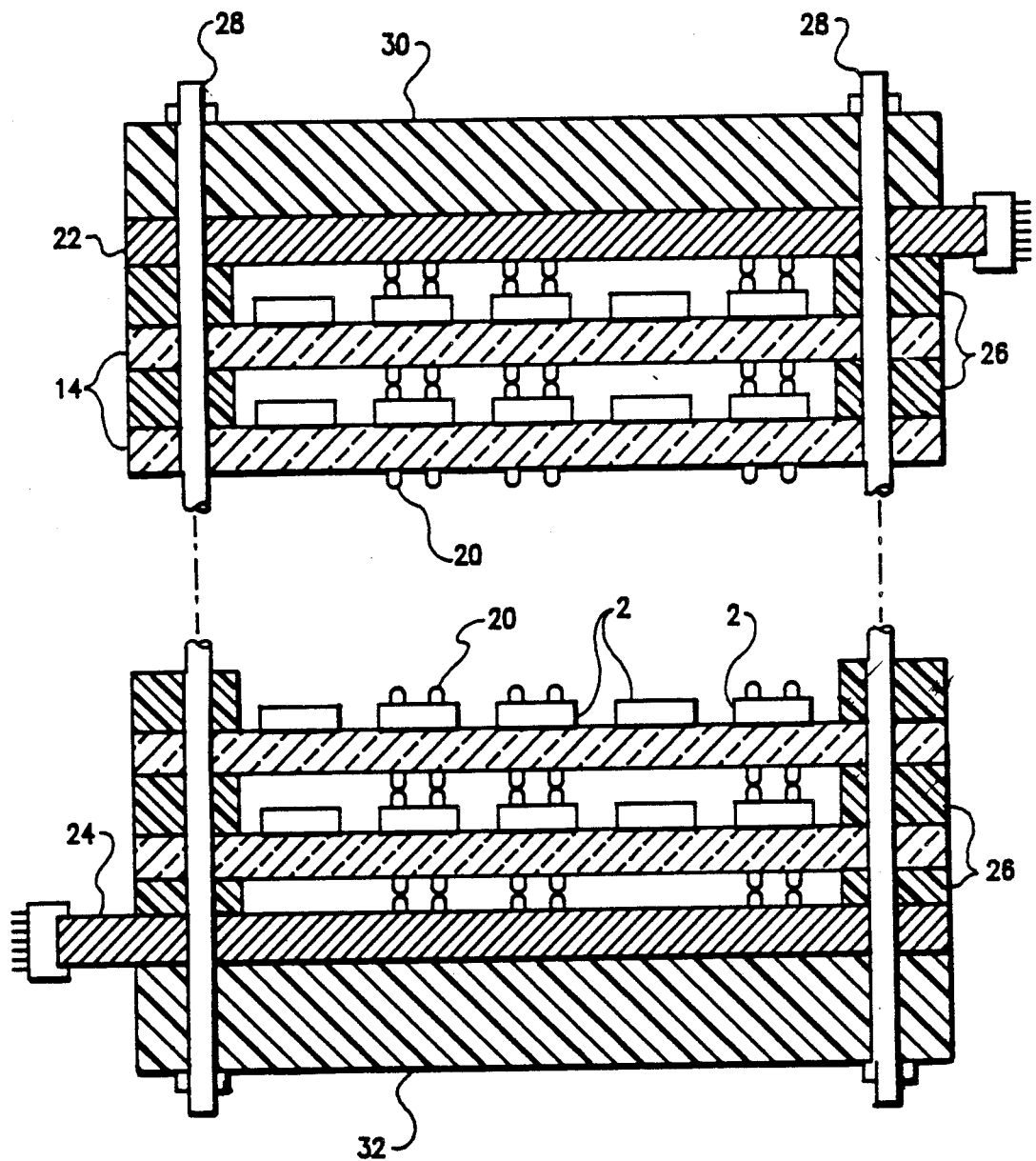
FIG. 5 is a sectional view of a 3-D stack of interconnected chip layers in accordance with the invention.

FIG. 5 illustrates in simplified form a stacked 3-D assembly of substrates 14, each substrate and the IC chips 2 which it carries forming one layer of the 3-D stack. Discrete IC chips can also be mixed with an IC on the wafer substrate itself. Each substrate makes electrical contact with the substrates immediately above and below via appropriate contacts 20, preferably microbridge spring connectors as described. This makes possible the formation of continuous data buses running through each of the substrates. As shown, the spring connectors are positioned directly on the upper surfaces of at least some of the IC chips 20 at desired locations in the circuits, and mate with corresponding springs connected to the substrate feedthroughs of the substrate immediately above. Input/output connectors 22 and 24 can be located immediately above and below the stack or at intermediate locations within the stack, and are similarly connected to the substrate stack by their own microbridge connector springs.

Dielectric spacer rings 26 are provided on the upper peripheral surface of each substrate to space the substrates apart from each other and leave enough room for the IC chips and connector springs. The stack is held tightly together by assembly bolts 28 which extend through aligned openings in the substrates 14, spacer rings 26 and in upper and lower cover plates 30 and 32. The use of the spacer rings 26 results in a continuous vertical mass of material which allows the substrates to be tightly packed together in a vibration resistant package. Other means of packaging the substrates together, such as the use of separate packing frames for each layer, can also be envisioned.

Figure 6:
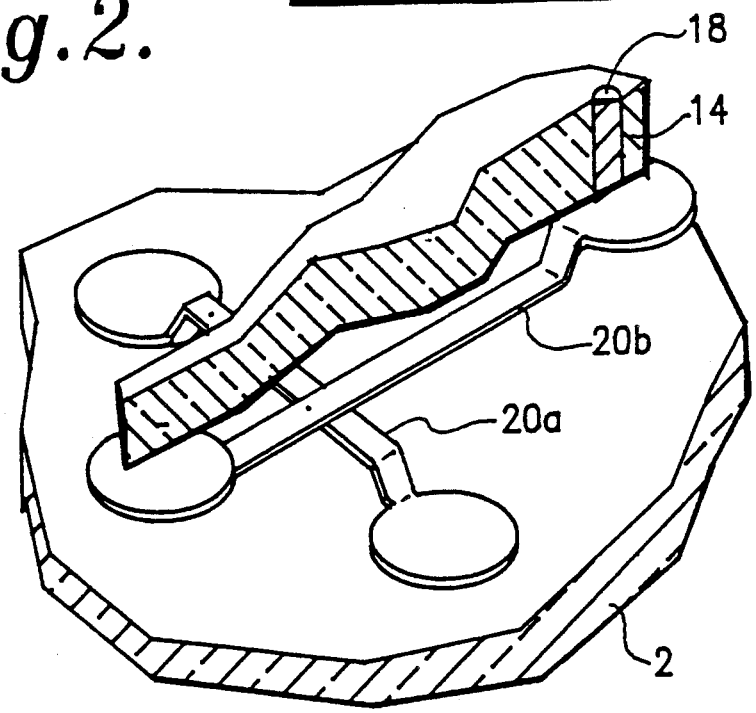
FIG. 6 is a cutaway perspective view showing the preferred way of interconnecting adjacent layers in a 3-D stack.

An enlarged view of the microbridge spring contacts 20 is given in FIG. 6. The contact 20a on an IC chip 2 is oriented at right angles to the contact 20b on the underside of the adjacent substrate 14 immediately above. Thus, when the chip and adjacent substrate are brought towards each other, the springs 20a, 20b make contact at right angles, forming a cross. This juxtaposition increases the probability of contact and ensures a more secure interconnection. Also, this arrangement accommodates a large degree of chip displacement while occupying only a small space. Another advantage is that, if desired, the stack may be disassembled and the individual chips dismounted for repair or replacement.

An alternate approach to the interlayer connection scheme is illustrated in FIG. 7. Instead of providing microbridge spring connectors directly on the IC chips, these points on the IC are electrically brought out to separate standoffs 34 by means of the chip feedthroughs and the substrate metallization routing. Standoffs 34 are mounted on the substrate and carry microbridge spring contacts 20 at their upper ends. The heights of the standoffs are selected to provide adequate clearance between the upper chip surfaces and the next substrate above, while connecting securely to the corresponding spring contacts on the underside of the substrate above.

Feedthroughs 36 within the standoffs connect the microbridge contact springs to the interconnect routing on the substrate of the surface, and thereby to the substrate feedthroughs 18. This approach allows for an even greater portion of the chip surface to be used for the IC, and thus further increases manufacturing yield. However, the standoffs occupy space on the substrate and reduce the number of chips that can be placed in a given substrate area.

Several illustrative embodiments of the invention have thus been shown and described which significantly enhance circuit packing density, while avoiding specific disadvantages of prior TAB, wire bond and flip chip connection schemes. While the invention has been illustrated as being specifically applicable to a 3-D assembly, it is also useful for 2-D configurations with single substrates. In this application the substrate feedthroughs can be eliminated. While the invention finds its highest application in conjunction with specially desired circuit layouts which take advantage of its high density features, it can also be used with standard circuit layouts and still achieve the mounting and quality control advantages mentioned above. For this use, feedthroughs could be provided in the original IC wafer at locations corresponding to the standard peripheral input/output ports of a conventional circuit layout, with the wafers then furnished to the manufacturer to use its standard process for fabricating the circuit.

Numerous other variations and alternate embodiments will occur to those skilled in the art without departing from the spirit and scope of the invention. Accordingly, it is intended that within the scope of the appended claims, the present invention may be practiced otherwise than as specifically described.

We claim:

1. An integrated circuit (IC) assembly, comprising:
    (a) a substrate having an electrical interconnect circuit on one side,
    (b) a plurality of IC chips, each chip encompassing a substantially smaller area than the substrate and comprising:
        (1) a chip body having opposed sides,
        (2) an IC on one side of the chip body, and
        (3) a plurality of electrically conductive chip feedthroughs electrically contacting respective locations on the IC on said one side of the chip body and extending through the chip body to its opposite side, and
    (c) means mechanically mounting said chips on said substrate with their respective ICs visually exposed and facing away from the substrate, said mounting means establishing electrical connections between said chip feedthroughs and selected locations on the substrate interconnect circuit, said substrate interconnect circuit electrically interconnecting at least some of said IC chips.

2. The IC assembly of claim 1, wherein said chip feedthroughs are connected to said substrate interconnect circuit by solder deposits.

3. The IC assembly of claim 1, said substrate having opposed sides, further comprising a plurality of electrically conductive substrate feedthroughs electrically contacting respective locations on said electrical interconnect circuit and extending through the substrate to its other side, said substrate feedthroughs being accessible for electrical connection to another structure from said other side of the substrate.

4. The IC assembly of claim 3, further comprising means on said other substrate side for electrically connecting to another IC assembly.

5. The IC assembly of claim 4, said means for electrically connecting to another IC assembly comprising a plurality of spring contacts electrically connected to respective substrate feedthroughs on said other substrate side.

6. The IC assembly of claim 1, the IC on each chip being bounded by a periphery, at least some of the feedthroughs of said IC chips being connected to their respective ICs at locations substantially of said periphery.

7. A 3-D integrated circuit (IC) assembly, comprising:
 (a) a plurality of stacked IC layers, each layer comprising:
  (1) a substrate having an electrical interconnect circuit on one side,
  (2) a plurality of IC chips, each chip comprising:
   (i) a chip body having opposed sides,
   (ii) an IC on one side of the chip body, and
   (iii) a plurality of electrically conductive chip feedthroughs electrically contacting respective locations on the IC on said one side of the chip body and extending through the chip body to its opposite side,
  (3) means mechanically mounting said chips on said substrate with their respective ICs facing away from the substrate, said mounting means establishing electrical connections between said chip feedthroughs and selected locations on the substrate interconnect circuit, said substrate interconnect circuit electrically interconnecting at least some of said IC chips, and
  (4) a plurality of electrically conductive substrate feedthroughs electrically contacting respective locations on said electrical interconnect circuit and extending through the substrate to its other side,
 (b) interlayer connector means electrically connecting selected locations on the IC chips with selected substrate feedthroughs of an adjacent layer, and
 (c) means mechanically holding said layers together in a stack.

8. The 3-D IC assembly of claim 7, said interlayer connector means comprising spring contacts.

9. The 3-D IC assembly of claim 8, wherein mating spring contacts are provide at the substrate feedthroughs on said other substrate sides, and on the IC chips of said adjacent layers.

10. The 3-D IC assembly of claim 8, each layer further comprising a plurality of standoffs on the same side of the substrate as the IC chips, wherein mating pairs of spring contacts are provided on said standoffs and at the substrate feedthroughs on said other substrate sides.

11. The 3-D IC assembly of claim 7, wherein the chip feedthroughs for each layer are connected to the substrate interconnect circuit for that layer by solder deposits.

12. The 3-D IC assembly of claim 7, the IC on each chip being bounded by a periphery, at least some of the feedthroughs of said IC chips connected to their respective IC at locations substantially inward of said periphery.

13. The 3-D IC assembly of claim 7, wherein the outermost layers at opposite ends of said assembly are electrically connected to respective input/output connector means rather than to respective adjacent layers on the other sides of the stack.

* * * * *